(12) United States Patent
Liu et al.

(10) Patent No.: US 9,646,116 B2
(45) Date of Patent: May 9, 2017

(54) NONLINEAR TERM SELECTION APPARATUS AND METHOD, IDENTIFICATION SYSTEM AND COMPENSATION SYSTEM

(71) Applicant: Fujitsu Limited, Kawasaki (JP)

(72) Inventors: Bo Liu, Beijing (CN); Weizhen Yan, Beijing (CN); Lei Li, Beijing (CN); Zhenning Tao, Beijing (CN)

(73) Assignee: FUJITSU LIMITED, Kawasaki (JP)

( * ) Notice: Subject to any disclaimer, the term of this patent is extended or adjusted under 35 U.S.C. 154(b) by 608 days.

(21) Appl. No.: 14/040,292

(22) Filed: Sep. 27, 2013

(65) Prior Publication Data

US 2014/0095129 A1    Apr. 3, 2014

(30) Foreign Application Priority Data

Sep. 28, 2012    (CN) .......................... 2012 1 0367929

(51) Int. Cl.
*G06F 7/60*    (2006.01)
*G06F 17/10*    (2006.01)
*G06F 17/50*    (2006.01)

(52) U.S. Cl.
CPC ...... *G06F 17/5009* (2013.01); *G06F 17/5036* (2013.01)

(58) Field of Classification Search
CPC .......................... G06F 17/5036; G06F 17/5009
USPC ............................................................. 703/2
See application file for complete search history.

(56) References Cited

U.S. PATENT DOCUMENTS

| 7,330,141 | B2* | 2/2008 | Temerinac | .......... H03M 1/1042 341/120 |
| 8,046,199 | B2* | 10/2011 | Copeland | .............. H03F 1/3247 703/2 |
| 2005/0021319 | A1* | 1/2005 | Li | .......................... G06F 17/504 703/2 |
| 2005/0187643 | A1* | 8/2005 | Sayyar-Rodsari | ... G05B 13/042 700/29 |
| 2006/0264187 | A1* | 11/2006 | Singerl | ............... G06F 17/5036 455/114.3 |
| 2008/0189087 | A1* | 8/2008 | Klippel | ............... G06F 17/5036 703/2 |

(Continued)

OTHER PUBLICATIONS

Dennis R. Morgan, et al., "A generalized memory polynomial model for digital predistortion of RF power amplifiers," IEEE Trans. Signal Process., vol. 54, No. 10, pp. 3852-3860, Oct. 2006.

(Continued)

*Primary Examiner* — Dwin M Craig
(74) *Attorney, Agent, or Firm* — Staas & Halsey LLP

(57) ABSTRACT

The embodiments of the present invention provide a nonlinear term selection apparatus and method, an identification system and a compensation system. The selection apparatus comprises: a linear coefficient calculator configured to measure linear properties of a nonlinear system by using measurement data, so as to obtain a plurality of linear coefficients; and a nonlinear term selector configured to select nonlinear model expanded terms of the nonlinear system by using the plurality of linear coefficients, so as to obtain nonlinear terms of the nonlinear system. With the embodiments of the present invention, the nonlinear model may be simplified, and the complexity of the nonlinear model may be lowered.

8 Claims, 10 Drawing Sheets

(56) References Cited

U.S. PATENT DOCUMENTS

| | | | |
|---|---|---|---|
| 2010/0007489 A1* | 1/2010 | Misra | G06Q 10/00 340/540 |
| 2010/0164620 A1* | 7/2010 | Hamada | H03F 1/3247 330/149 |
| 2010/0225390 A1* | 9/2010 | Brown | H03F 1/26 330/149 |
| 2011/0119036 A1* | 5/2011 | Pino | G06F 17/5036 703/2 |
| 2011/0270590 A1* | 11/2011 | Aparin | G06K 9/00496 703/2 |

OTHER PUBLICATIONS

Simon Haykin "Adaptive Filter Theory", Publishing House of Electronics Industry, ISBN: 9787121106651, May 1, 2010. (Chinese version filed Feb. 10, 2014 in an Information Disclosure Statement).

\* cited by examiner

"Prior art"

"Prior art"

NONLINEAR TERM SELECTION APPARATUS AND METHOD, IDENTIFICATION SYSTEM AND COMPENSATION SYSTEM

CROSS REFERENCE TO RELATED APPLICATIONS

This claims the benefit of Chinese Application No. 201210367929.9, filed Sep. 28, 2012, the disclosure of which is incorporated herein by reference.

TECHNICAL FIELD

The present invention relates to the field of system modeling and compensation of a nonlinear device in a communication system and, in particular to a nonlinear term selection apparatus and method, an identification system and a compensation system, related to a nonlinear model of Volterra series expansion.

BACKGROUND ART

Volterra series expansion is a common method describing a nonlinear system, and is featured in that an output value of the system at a certain point in time is related to all input values in a preceding period of time; hence, it is adapted to describe a nonlinear system with a memory effect. And it is frequently used in a communication system to build a model of such a device as a power amplifier, etc.

Currently, a memory nonlinear system may be described by using a Weiner model according to the features thereof. FIG. 1 is a schematic block diagram of a Weiner structure. A module 101 is a linear filter, and let its coefficients be $A_1$, $A_2 \ldots A_m$, its input signal be Y, and its output signal be X. And a module 102 is a memoryless nonlinear device, and let its coefficients be $B_0, B_1, B_2 \ldots B_k$, its input signal be X, and its output signal be Z.

For module 101, $X_T = \sum_{i=1}^{m} A_i Y_{T+1-i}$, where, $X_T$ denotes an output signal of module 101 at a moment T, and $Y_{T+1-i}$ denotes an (i−1)-th input signal of module 101 before the moment T, denoting an input signal at the moment T when i=1. For module 102, $Z_T = B_0 + \sum_{n=1}^{k} B_n (X_T)^n$, where, $X_T$ denotes an input signal of module 102 at the moment T, and $Z_T$ denotes an output signal of module 102 at the moment T. Therefore, the Volterra series expansion of the whole system may be described as:

$$Z_T = B_0 + \sum_{n=1}^{k} B_n \left( \sum_{i=1}^{m} A_i Y_{T+1-i} \right)^n \quad (1)$$

FIG. 2 is a schematic diagram of nonlinear modeling of the prior art, giving a general modeling method of a nonlinear model, wherein a module 201 is a nonlinear apparatus/system, a model 202 (nonlinear model terms) is various common nonlinear model expansion terms (such as Volterra series expansion), a module 203 performs calculation, and a module 204 obtains a nonlinear model. Therefore, a nonlinear model may be obtained by using measurement data to calculate (such as methods of RLS, and MLS, etc.) coefficients of various nonlinear terms.

However, it was found by the inventors that the number of the terms of Volterra series is exponentially increased as the increase of the memory length and number of orders of a model, so that the complexity of the model is greatly increased, thereby lowering the application value of the model. The method shown in FIG. 2 does not screen the nonlinear terms of the system according to characteristics of the system, which may bring problems such as over-training, in addition to excessive terms and high complexity, causing the precision of the model to be lowered.

Documents advantageous to the understanding of the present invention and the prior art are listed below, which are incorporated herein by reference, as they are fully described herein.

Document 1: D. Morgan, Z. Ma, J. Kim, M. Zierdt, and J. Pastalan, "A generalized memory polynomial model for digital predistortion of RF power amplifiers," IEEE Trans. Signal Process., vol. 54, no. 10, pp. 3852-3860, October 2006.); and Document 2: *Adaptive Filter Theory*, Simon Haykin, translated by Baoyu Zheng, et al.; ISBN: 9787121106651, May 1, 2010, Publishing House of Electronics Industry.

SUMMARY OF THE INVENTION

The embodiments of the present invention provide a nonlinear term selection apparatus and method, an identification system and a compensation system, with an object being to lower the complexity of a nonlinear model and improve the precision of the model.

According to an aspect of the embodiments of the present invention, there is provided a nonlinear term selection apparatus, comprising:

a linear coefficient calculator, configured to measure linear properties of a nonlinear system by using measurement data, so as to obtain a plurality of linear coefficients; and a nonlinear term selector, configured to select nonlinear model expanded terms of the nonlinear system by using the plurality of linear coefficients, so as to obtain nonlinear terms of the nonlinear system.

According to another aspect of the embodiments of the present invention, there is provided a nonlinear term selection method, comprising:

measuring linear properties of a nonlinear system by using measurement data, so as to obtain a plurality of linear coefficients; and selecting nonlinear model expanded terms of the nonlinear system by using the plurality of linear coefficients, so as to obtain nonlinear terms of the nonlinear system.

According to a further aspect of the embodiments of the present invention, there is provided a nonlinear identification system, comprising:

a linear coefficient calculator, configured to measure linear properties of a nonlinear system by using measurement data, so as to obtain a plurality of linear coefficients;

a nonlinear term selector, configured to select nonlinear model expanded terms of the nonlinear system by using the plurality of linear coefficients, so as to obtain nonlinear terms of the nonlinear system;

a nonlinear coefficient calculator, configured to measure nonlinear properties of the nonlinear system by using measurement data, so as to obtain a plurality of nonlinear coefficients; and a nonlinear model builder, configured to obtain a nonlinear model of the nonlinear system according to the nonlinear terms and the nonlinear coefficients.

According to still another aspect of the embodiments of the present invention, there is provided a nonlinear compensation system, comprising:

a linear coefficient calculator, configured to measure linear properties of an inverse system of a nonlinear system by using measurement data, so as to obtain a plurality of linear coefficients;

a nonlinear term selector, configured to select nonlinear model expanded terms of the inverse system by using the plurality of linear coefficients, so as to obtain nonlinear terms of the inverse system;

a nonlinear coefficient calculator, configured to measure nonlinear properties of the inverse system by using measurement data, so as to obtain a plurality of nonlinear coefficients of the inverse system; and a nonlinear model compensator, configured to obtain a compensation model of the nonlinear system according to the nonlinear terms and the nonlinear coefficients of the inverse system.

The advantage of the present invention exists in: expansion terms of the nonlinear model are selected by using linear coefficients, and the terms of relatively less contribution are discarded while the terms of relatively more contribution are kept, thereby simplifying the nonlinear model, and lowering the complexity of the nonlinear model.

With reference to the following description and drawings, the particular embodiments of the present invention are disclosed in detail, and the principle of the present invention and the manners of use are indicated. It should be understood that the scope of the embodiments of the present invention is not limited thereto. The embodiments of the present invention contain many alternations, modifications and equivalents within the spirits and scope of the terms of the appended claims.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, integers, steps or components but does not preclude the presence or addition of one or more other features, integers, steps, components or groups thereof.

DETAILED DESCRIPTION OF THE INVENTION

Figure 1:
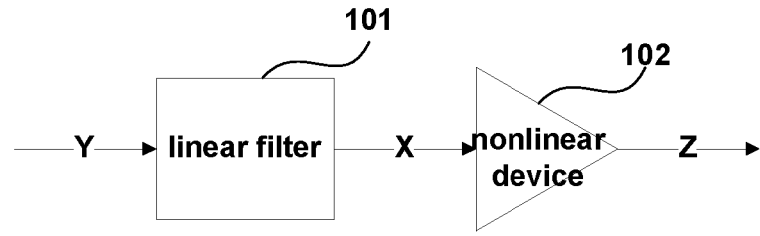
FIG. 1 is a schematic block diagram of a Weiner structure.
Figure 2:
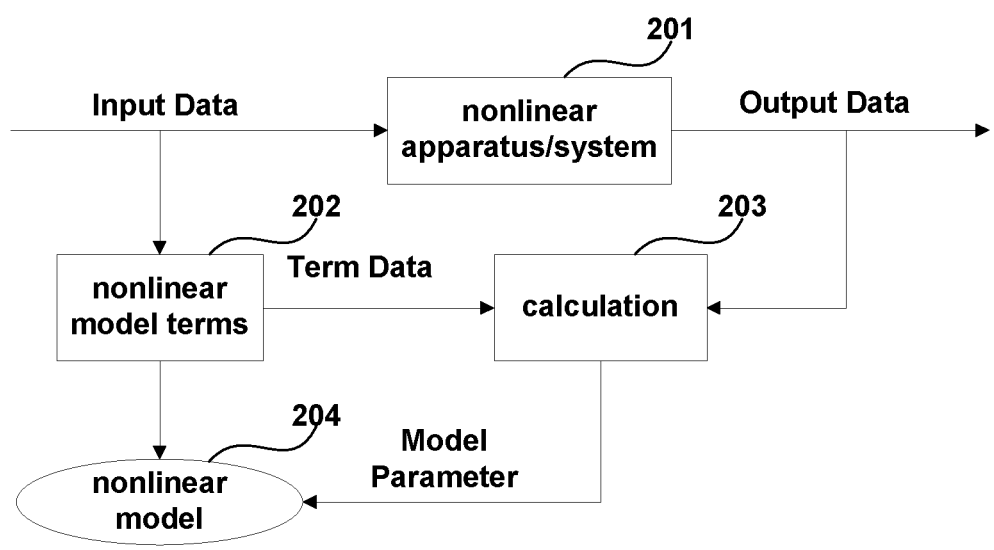
FIG. 2 is a schematic diagram of nonlinear modeling of the prior art.

The above and other features of the present invention will be apparent through the following description with reference to the accompanying drawings. In the description and drawings, particular embodiments of the present invention are disclosed, which indicate some ways of carrying out the principle of the present invention. It should be understood that the present invention is not limited to the described embodiments. On the contrary, the present invention covers all the modifications, variants and equivalents falling within the scope of the appended claims.

In the present invention, formula (1) may be expanded and the formula below may be obtained:

$$Z_T = B_0 + \sum_{n=1}^{k} B_n \left( \sum_{p=1}^{m} \sum_{q=1}^{m-p+1} \sum_{\Sigma n_i = n} (C_n^{n_1} C_{n-n_1}^{n_2} C_{n-n_1-n_2}^{n_3} \ldots C_{n_p}^{n_p}) (A_q^{n_1} A_{q+1}^{n_2} \ldots A_{q+p-1}^{n_p}) (Y_{T+1-q}^{n_1} Y_{T-q}^{n_2} \ldots Y_{T+1-q-p}^{n_m}) \right)$$

where, $(C_n^{n_1} C_{n-n_1}^{n_2} C_{n-n_1-n_1}^{n_2} \ldots C_{n_p}^{n_p})$ is a coefficient of a term multiplied by p different terms after expansion of power n of the polynomial obtained according to a polynomial theorem, $C_n^{n_1}$ denotes the number of combinations selecting $n_1$ from n, $A_q^{n_1}$ denotes power $n_1$ of a linear coefficient $A_q$, and $Y_{T+1-q}^{n_1}$ denotes power $n_1$ of a (q−1)-th input signal before a moment T. Any term coefficient after Volterra expansion of the model may be obtained from the formula above.

For a term having a constant number of orders, its coefficient is decided jointly by $B_n$, $(C_n^{n_1} C_{n-n_1}^{n_2} C_{n-n_1-n_2}^{n_2} \ldots C_{n_q}^{n_p})$, $(A_q^{n_1} A_{q+1}^{n_2} \ldots A_{q+p-1}^{n_p})$, where $(C_n^{n_1} C_{n-n_1}^{n_2} C_{n-n_1-n_1}^{n_3} \ldots C_{n_q}^{n_p})$ is uniquely decided by the number n of orders and the number of orders of each of the product terms, and thus, the relative size of the overall coefficient in coefficients of the same order is decided by $(A_q^{n_1} A_{q+1}^{n_2} \ldots A_{q+p-1}^{n_p})$. Therefore, relative sizes of the terms in the nonlinear coefficients of a system may be discussed by measuring the linear coefficients $A_1, A_2 \ldots A_m$ of the system.

Taking a target system as a linear system and a nonlinear effect brought by the nonlinear module 102 as noise, the linear coefficients $A_1, A_2 \ldots A_m$ of the system may be calculated by using a least mean square (LMS) error method, and a recursive least square (RLS) method, etc. The $(C_n^{n_1} C_{n-n_1}^{n_2} C_{n-n_1-n_2}^{n_3} \ldots C_{n_q}^{n_p})(A_q^{n_1} A_{q+1}^{n_2} \ldots A_{q+p-1}^{n_p})$ part in the coefficients of an arbitrary term of an n-th order may be calculated by using $A_1, A_2 \ldots A_m$. For constant terms of the n-th order, $B_n$ is a fixed value, and $(C_n^{n_1} C_{n-n_1}^{n_2} C_{n-n_1-n_2}^{n_3} \ldots C_{n_q}^{n_p})(A_q^{n_1} A_{q+1}^{n_2} \ldots A_{q+p-1}^{n_p})$ may denote the relative size of the coefficient of this term in the coefficients of all the terms of the n-th order.

In the present invention, a threshold value (for example, 0.01) may be set, and a term may be deemed as being of relatively less contribution in the terms of the n-th order if the absolute value of the ratio of its coefficient to the maximum value in all the coefficients is less than the threshold value, and the effect on the precision of the model is relatively less if the term is discarded. With this rule, the Volterra expansion terms of the system may be screened in advance by using the linear coefficients of the system, terms of relatively less contribution may be discarded, and terms of relatively large contribution may be kept, thereby simplifying the Volterra expansion terms and achieving the object of lowering the complexity. The present invention shall be described below in detail.

Embodiment 1

An embodiment of the present invention provides a nonlinear term selection apparatus, for selecting nonlinear terms of a nonlinear system.

Figure 3:
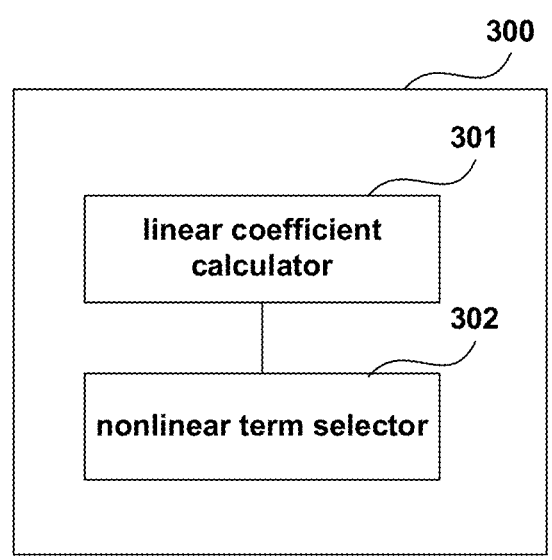
FIG. 3 is a schematic diagram of the structure of the selection apparatus of embodiment 1 of the present invention.

FIG. 3 is a schematic diagram of the structure of the selection apparatus of the embodiment of the present invention. As shown in FIG. 3, a selection apparatus 300 comprises: a linear coefficient calculator 301 and a nonlinear term selector 302;

in this case, the linear coefficient calculator 301 is configured to measure linear properties of a nonlinear system by using measurement data, so as to obtain a plurality of linear coefficients; and the nonlinear term selector 302 is configured to select nonlinear model expanded terms of the nonlinear system by using the plurality of linear coefficients, so as to obtain nonlinear terms of the nonlinear system.

In this embodiment, the nonlinear system may be the system as shown in FIG. 1, which may be described by using a Weiner model. The linear coefficient calculator 301 may use measurement data to measure linear features of the nonlinear system, so as to obtain multiple nonlinear coefficients of the nonlinear system. The prior art may be referred to for detailed calculation.

Figure 4:
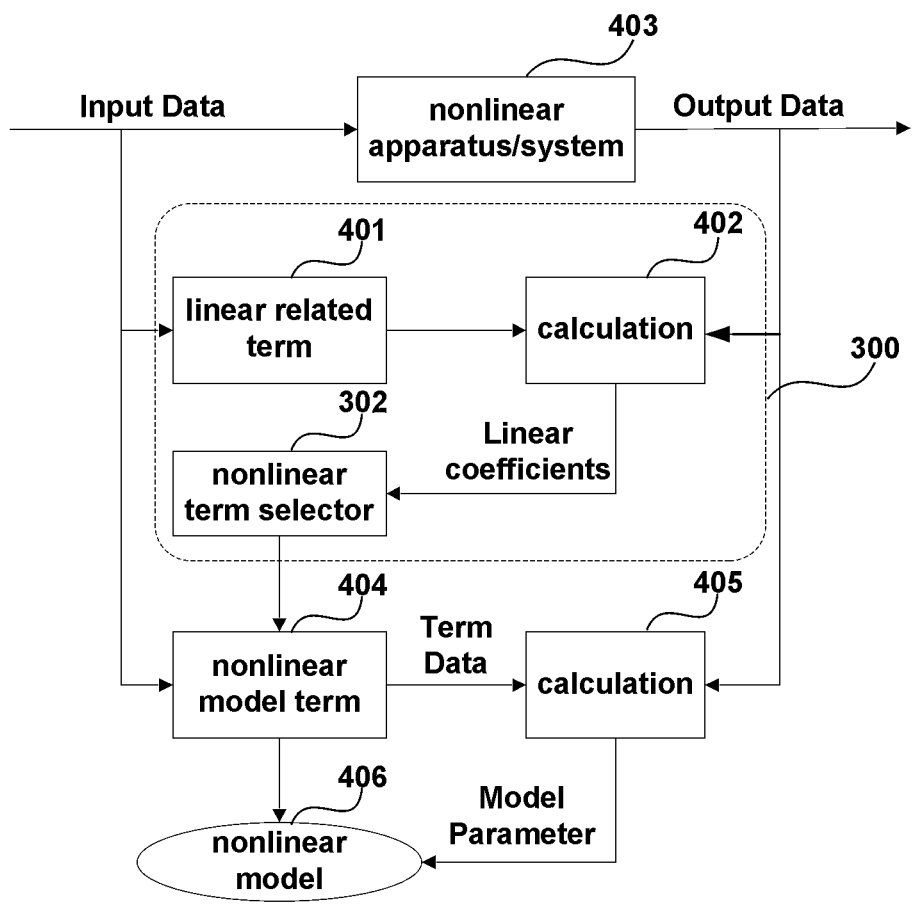
FIG. 4 is a schematic diagram of the nonlinear modeling of embodiment 1 of the present invention.

FIG. 4 is a schematic diagram of the nonlinear modeling of the embodiment of the present invention. As shown in FIG. 4, nonlinear terms may be obtained by the selection apparatus 300 for nonlinear terms, wherein the linear coefficient calculator 301 may include a linear related term module 401 and a calculation module 402.

As shown in FIG. 4, the input of the nonlinear system 403 is Y, and the output is Z. The coefficients of the nonlinear terms may be obtained by a nonlinear model term module 404 and a calculation module 405, and a nonlinear model may be obtained by a nonlinear model module 406.

That is to say, in this embodiment, measurement data may be used first to measure linear features, so as to obtain its linear coefficients; with reference to the linear coefficients, the selection apparatus 300 is used to select nonlinear model expansion terms, terms of relatively less contribution are discarded, and terms of relatively large contribution are kept, thereby obtaining the nonlinear terms of the system. And the measurement data are used to calculate the coefficients of the nonlinear terms, so as to obtain a simplified nonlinear model.

Figure 5:
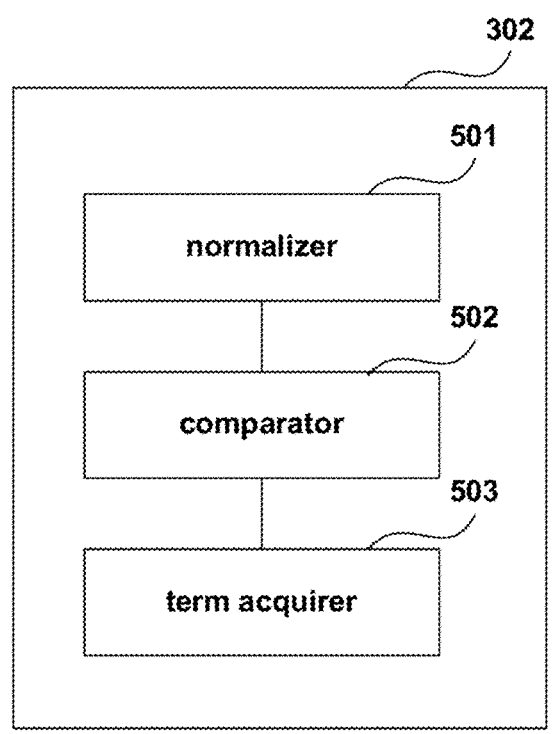
FIG. 5 is a schematic diagram of the structure of the nonlinear term selector of embodiment 1 of the present invention.

In particular implementation, the nonlinear term selector 302 may perform normalization, and may compare with a predetermined threshold value. FIG. 5 is a schematic diagram of the structure of the nonlinear term selector 302 of the embodiment of the present invention.

As shown in FIG. 5, the nonlinear term selector 302 may comprise a normalizer 501, a comparator 502 and a term acquirer 503, wherein the normalizer 501 is configured to normalize the plurality of linear coefficients and form absolute values, the comparator 502 is configured to compare the coefficients outputted by the normalizer 501 with the predefined threshold value, and the term acquirer 503 is configured to acquire nonlinear terms of the nonlinear system based on the coefficients greater than or equal to the threshold value.

In an embodiment, the term acquirer 503 may be configured to take the coefficients greater than or equal to the threshold value as first-order term coefficients, and the terms corresponding to them as the first-order terms; pairwise multiply the first-order term coefficients by N−1 order term coefficients, and after combining the products having identical terms, select the coefficients greater than or equal to the threshold value as the N-order term coefficients, and the terms corresponding to them as the N-order terms, where, N is a positive integer greater than 1.

Figure 6:
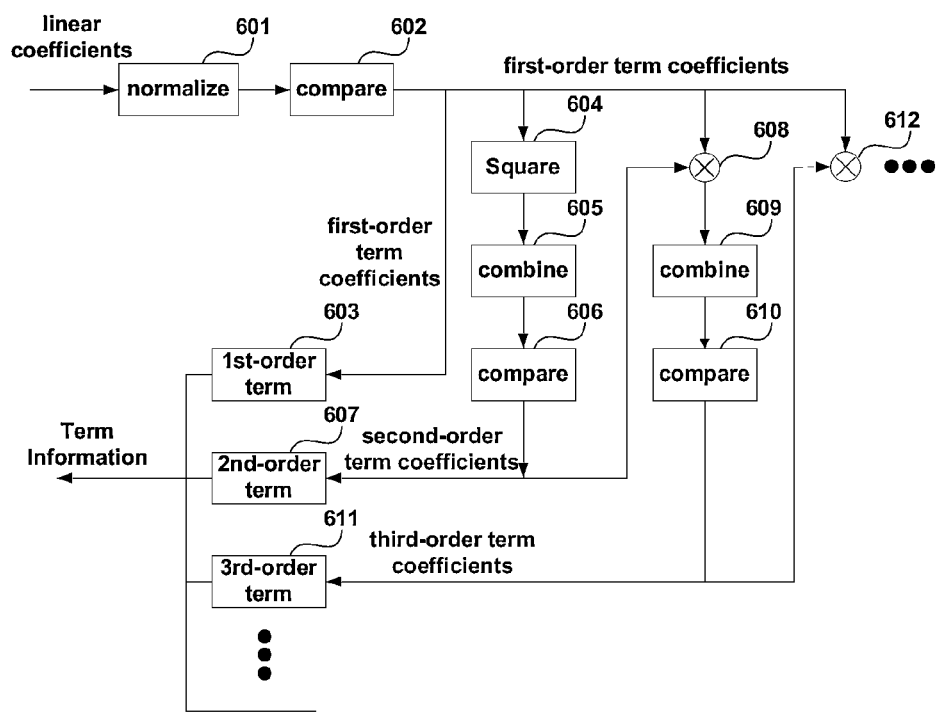
FIG. 6 is a schematic diagram of acquiring nonlinear terms of embodiment 1 of the present invention.

FIG. 6 is a schematic diagram of the acquiring nonlinear terms of the embodiment of the present invention, giving an interior structure of the nonlinear term selector 302 shown in FIG. 3. As shown in FIG. 6, the linear coefficients are normalized and form absolute values first (601), making the maximum absolute value be 1; and then the coefficients are compared with the threshold value (for example, 0.01) and those terms less than the threshold value are discarded (602); the rest of the coefficients are taken as first-order term reference coefficients, the terms corresponding to them being screened first-order terms (603).

And in this embodiment, the first-order term reference coefficients may be pairwise multiplied by the coefficients of themselves (604), the products having identical terms may be combined (605), compared with the threshold value and the coefficients less than the threshold value may be discarded (606), the obtained group of coefficients is taken as second-order term reference coefficients and the corresponding terms are the second-order terms (607); the second-order term reference coefficients are pairwise multiplied by the first-order term reference coefficients (608), the products having identical terms are combined (609), the coefficients less than the threshold value are discarded (610), and the obtained coefficients are taken as third-order term reference coefficients (611), and the corresponding terms are the third-order terms. Likewise, in evaluating N-order terms, it is only needed to pairwise multiply N−1 order term reference coefficients by the first-order term reference coefficients, combine the products having identical terms and discard the coefficients less than the threshold value, and the terms to which the rest N-order term reference coefficients correspond are the N-order terms, until a required number of orders is reached.

In another embodiment, the term acquirer 503 may be further configured to take the coefficients greater than or equal to the threshold value as first-order term coefficients, and the terms corresponding to them as the first-order terms; select N of the first-order term coefficients to be multiplied and calculate all the combinations, and after combining the products having identical terms, take the coefficients greater than or equal to the threshold value as the N-order term coefficients, and the terms corresponding to them as the N-order terms, where, N is a positive integer greater than 1.

Figure 7:
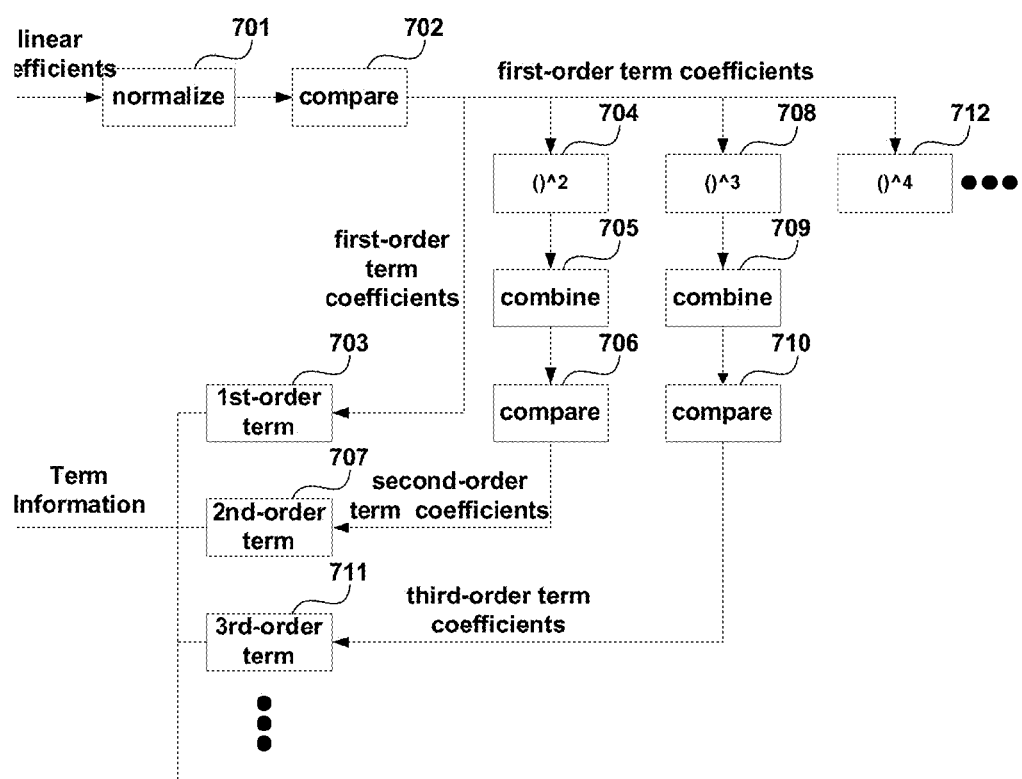
FIG. 7 is another schematic diagram of acquiring nonlinear terms of embodiment 1 of the present invention.

FIG. 7 is another schematic diagram of the acquiring nonlinear terms of the embodiment of the present invention, giving another interior structure of the nonlinear term selector 302 shown in FIG. 3. As shown in FIG. 7, the group of linear coefficients is normalized and form absolute values first (701), making the maximum absolute value be 1; and then the coefficients are compared with the threshold value (for example, 0.01) and those terms less than the threshold value are discarded (702); the rest of the coefficients are taken as first-order term reference coefficients, the terms corresponding to them being screened first-order terms (703).

And in this embodiment, the first-order term reference coefficients may be pairwise multiplied by the coefficients of themselves (704), the products having identical terms may be combined (705), the coefficients less than the threshold value may be discarded (706), the obtained group of coefficients is taken as second-order term reference coefficients and the corresponding terms are the second-order terms (707); any three of the first-order term reference coefficients are selected to be multiplied (708), all the combinations are traversed, and the products having identical terms are combined (709); the coefficients less than the threshold value are discarded (710), and the obtained coefficients are taken as third-order term reference coefficients (711), and the corresponding terms are the third-order terms. Likewise, in evaluating N-order terms, it is only needed to select any N of the first-order term reference coefficients to be multiplied, all the combinations are traversed, the products having identical terms are combined and the coefficients less than the threshold value are discarded, and the terms to which the rest N-order term reference coefficients correspond are the N-order terms, until a required number of orders is reached.

It should be noted that the above description is schematically given for the structure of a nonlinear term selector only. However, the present invention is not limited thereto, and particular implementation may be determined as actually required.

Figure 8:
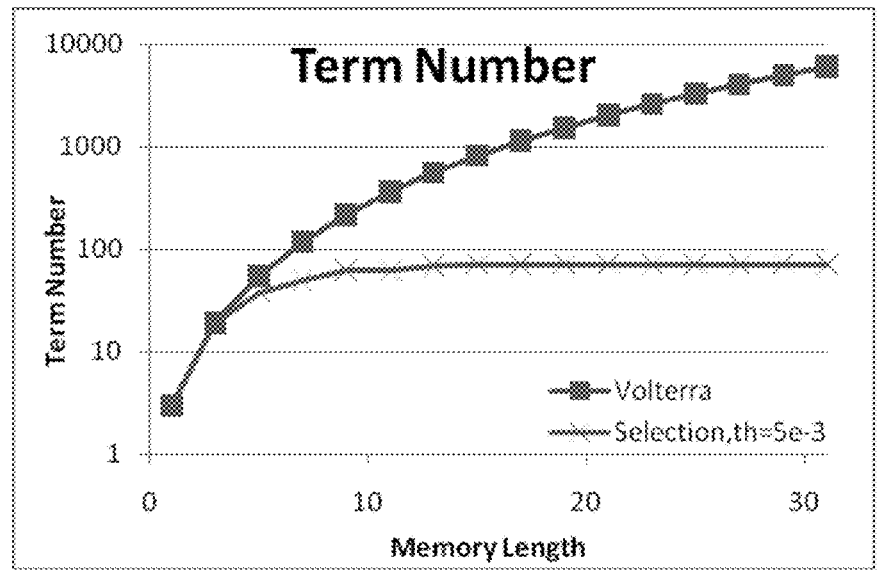
FIG. 8 is a schematic diagram of the number of terms of modeling of a typical third-order memory nonlinear system.

FIG. 8 is a schematic diagram of the number of terms of modeling of a typical third-order memory nonlinear system, in which the number of terms of the Volterra expansion modeling and the number of terms of modeling after being screened by using the present invention are compared, wherein in the present invention, the threshold value (th) is selected as 5e-3.

Figure 9:
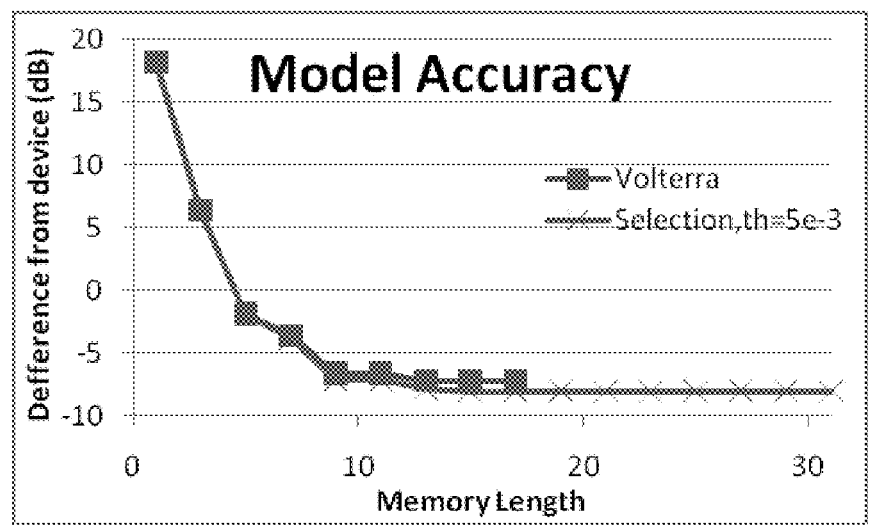
FIG. 9 is a schematic diagram of the model precision of the third-order memory nonlinear system shown in FIG. 8.

FIG. 9 is a schematic diagram of the model precision of the third-order memory nonlinear system shown in FIG. 8, in which the model precision of the Volterra expansion modeling and the model precision of modeling after being screened by using the present invention are compared, wherein corresponding model data are hard to be obtained for the Volterra expansion of a memory length greater than 17, as its complexity is extremely high.

In this case, the longitudinal coordinate in FIG. 9 may denote a ratio of the difference between the model output and the actual system output to the actual system output data, with identical input data; the unit being dB.

It can be seen from FIGS. 8 and 9 that the model built by the present invention is equivalent to the Volterra model using whole terms with respect to precision, but the number of the terms may be reduced by more than one order of magnitude.

It can be seen from the above embodiment that expansion terms of the nonlinear model are selected by using linear coefficients, and the terms of relatively less contribution are discarded while the terms of relatively more contribution are kept, thereby simplifying the nonlinear model, and lowering the complexity of the nonlinear model.

Embodiment 2

An embodiment of the present invention provides a nonlinear term selection method, corresponding to the nonlinear term selection apparatus of the embodiment 1, with the identical contents being not going to be described any further.

Figure 10:
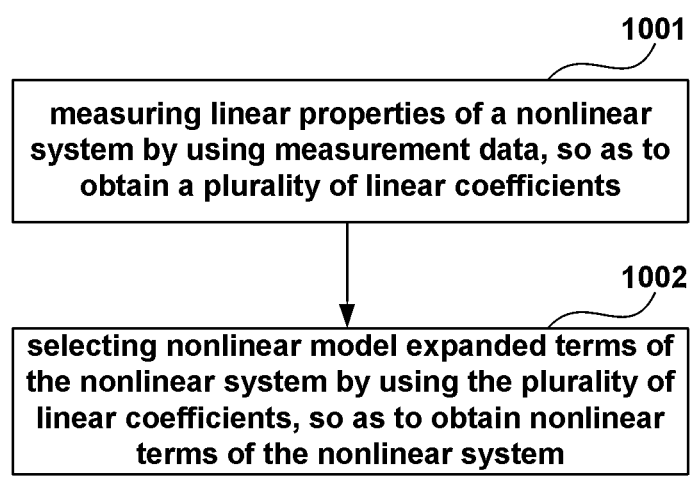
FIG. 10 is a flowchart of the selection method of embodiment 2 of the present invention.

FIG. 10 is a flowchart of the selection method of an embodiment of the present invention. As shown in FIG. 10, the selection method comprises:

step 1001: measuring linear properties of a nonlinear system by using measurement data, so as to obtain a plurality of linear coefficients; and step 1002: selecting nonlinear model expanded terms of the nonlinear system by using the plurality of linear coefficients, so as to obtain nonlinear terms of the nonlinear system.

In the particular implementation, the selecting nonlinear model expanded terms of the nonlinear system by using the plurality of linear coefficients in step 1002 may comprise: normalizing the plurality of linear coefficients and forming absolute values; comparing the normalized coefficients with a predefined threshold value; and acquiring nonlinear terms of the nonlinear system based on the coefficients greater than or equal to the threshold value.

In an embodiment, the acquiring nonlinear terms of the nonlinear system is based on the coefficients greater than or equal to the threshold value may comprise: taking the coefficients greater than or equal to the threshold value as first-order term coefficients, and taking the terms to which the first-order term coefficients correspond as first-order terms; and multiplying the first-order term coefficients by N−1 order term coefficients in a pairwise manner, selecting the coefficients greater than or equal to the threshold value as N order term coefficients after combining products having identical terms, and taking the terms to which the N order term coefficients correspond as N order terms, where N is a positive integer greater than 1.

In another embodiment, the acquiring nonlinear terms of the nonlinear system based on the coefficients greater than or equal to the threshold value may comprise: take the coefficients greater than or equal to the threshold value as first-order term coefficients, and take the terms to which the first-order term coefficients correspond as first-order terms; and multiply N coefficients selected from the first-order term coefficients and calculate all the combinations, select the coefficients greater than or equal to the threshold value as N order term coefficients after combining products having identical terms, and take the terms to which the N order term coefficients correspond as N order terms, where N is a positive integer greater than 1.

It can be seen from the above embodiment that expansion terms of the nonlinear model are selected by using linear coefficients, and the terms of relatively less contribution are discarded while the terms of relatively more contribution are kept; thereby simplifying the nonlinear model, and lowering the complexity of the nonlinear model.

Embodiment 3

On the basis of the embodiment 1, an embodiment of the present invention provides a nonlinear identification system, with the contents identical to those of the embodiment 1 being not going to be described any further.

In this embodiment, the identification system may comprise: a linear coefficient calculator, a nonlinear term selector, a nonlinear coefficient calculator and a nonlinear model builder.

In this case, the linear coefficient calculator is configured to measure linear properties of a nonlinear system by using measurement data, so as to obtain a plurality of linear coefficients; the nonlinear term selector is configured to select nonlinear model expanded terms of the nonlinear system by using the plurality of linear coefficients, so as to obtain nonlinear terms of the nonlinear system; the nonlinear coefficient calculator is configured to measure nonlinear properties of the nonlinear system by using measurement data, so as to obtain a plurality of nonlinear coefficients of the nonlinear system; and the nonlinear model builder is configured to obtain a nonlinear model of the nonlinear system according to the nonlinear terms and the nonlinear coefficients.

In this embodiment, the linear coefficient calculator and the nonlinear term selector may constitute the nonlinear term selection apparatus as described in the embodiment 1, and the identification system may correspond to the nonlinear modeling shown in FIG. 4.

It can be seen from the above embodiment that expansion terms of the nonlinear model are selected by using linear coefficients, and the terms of relatively less contribution are discarded while the terms of relatively more contribution are kept; thereby simplifying the nonlinear model, and lowering the complexity of the nonlinear model.

Embodiment 4

On the basis of the embodiment 1, an embodiment of the present invention provides a nonlinear compensation system, with the contents identical to those of the embodiment 1 being not going to be described any further.

In this embodiment, the compensation system may comprise: a linear coefficient calculator, a nonlinear term selector, a nonlinear coefficient calculator and a nonlinear model compensator.

In this case, the linear coefficient calculator is configured to measure linear properties of an inverse system of a nonlinear system by using measurement data, so as to obtain a plurality of linear coefficients; the nonlinear term selector is configured to select nonlinear model expanded terms of the inverse system by using the plurality of linear coefficients, so as to obtain nonlinear terms of the inverse system; the nonlinear coefficient calculator is configured to measure nonlinear properties of the inverse system by using measurement data, so as to obtain a plurality of nonlinear coefficients of the inverse system; and the nonlinear model compensator is configured to obtain a compensation model of the nonlinear system according to the nonlinear terms and the nonlinear coefficients of the inverse system.

In this embodiment, the major difference between building a compensation model and building an identification model (device/system model) exists in: in building a system/device model, the input signals are taken as source data, the output signals are taken as target data, and the model is obtained by selecting certain terms and calculating the coefficients of the terms. The model output obtained after inputting identical input signals into the model is very close to actual output signals of the device/system.

While in building a compensation model, the output signals are taken as source data, the input signals are taken as target data, and the compensation model is obtained by selecting certain terms and calculating the coefficients of the terms. The model output obtained after inputting actual output signals of the device/system into the model is very close to actual input signals of the device/system.

Figure 11:
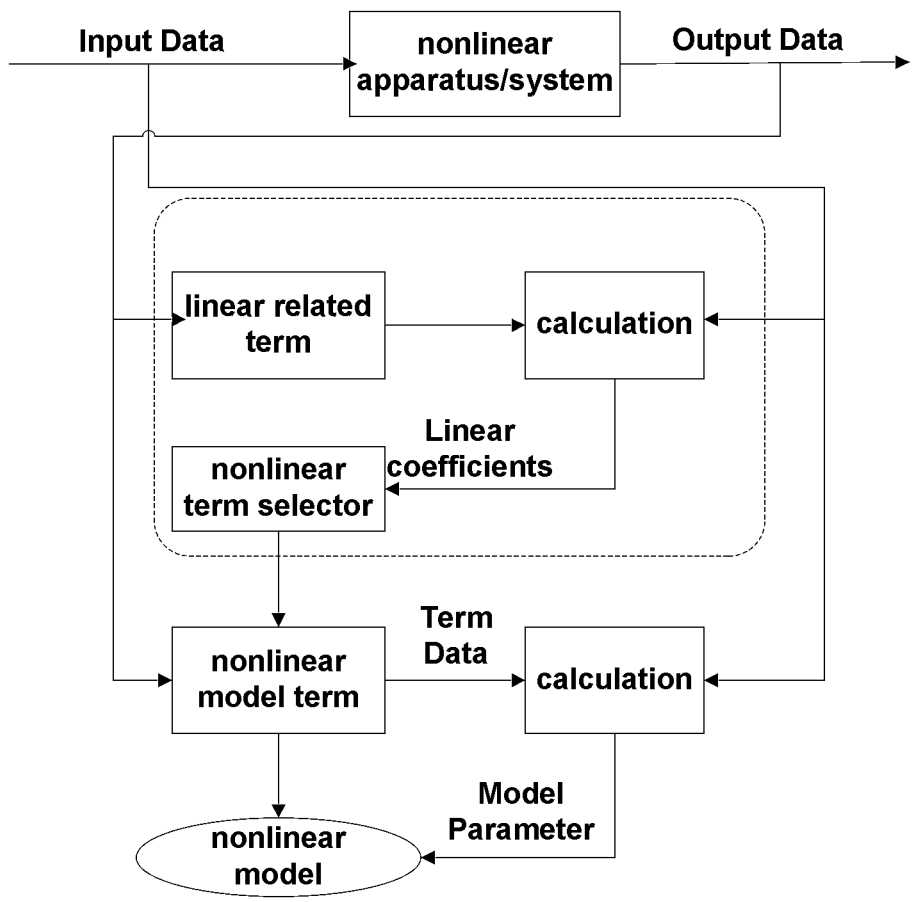
FIG. 11 is a schematic diagram of building a compensation model of embodiment 4 of the present invention.

FIG. 11 is a schematic diagram of building a compensation model of an embodiment of the present invention. As shown in FIG. 11, the input signals and the output signals may be interchanged, taking the output data as the source data, and the input data as the target data. The linear coefficients of the inverse system of the target system may be measured first, and then the nonlinear term selector may be used to obtain the nonlinear compensation terms of the inverse system. Corresponding coefficients may be calculated by using such methods as RLS, and MLS, etc., so as to obtain an inverse model with input/output being inverse to that of the target device or system, which may be used for compensating for it nonlinearly.

Figure 12:
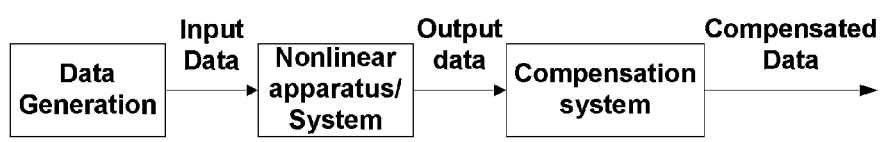
FIG. 12 is a schematic diagram of applying the compensation model to a receiving side of embodiment 4 of the present invention.
Figure 13:
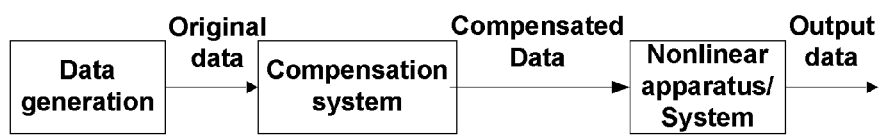
FIG. 13 is a schematic diagram of applying the compensation model to a transmitting side of embodiment 4 of the present invention.

FIG. 12 is a schematic diagram of applying the compensation model to a receiving side, and FIG. 13 is a schematic diagram of applying the compensation model to a transmitting side. As shown in FIGS. 12 and 13, the compensation model is applied to a communication system.

In this case, in FIG. 12, compensation is performed at the receiving side, and a compensation model is used to process the output data of the nonlinear device/system, so as to obtain compensation data close to the input data. And in FIG. 13, compensation is performed at the transmitting side, the compensation model is used to pre-compensate for the transmission data, and data close to the original data are obtained after the pre-compensated data pass through the nonlinear device/system.

The above apparatuses and methods of the present invention may be implemented by hardware, or by hardware in combination with software. The present invention relates to such a computer-readable program that when the program is executed by a logic device, the logic device is enabled to carry out the apparatus or components as described above, or to carry out the methods or steps as described above. The present invention also relates to a storage medium for storing the above program, such as a hard disk, a floppy disk, a CD, a DVD, and a flash memory, etc.

The present invention is described above with reference to particular embodiments. However, it should be understood by those skilled in the art that such a description is illustrative only, and not intended to limit the protection to scope of the present invention. Various variants and modifications may be made by those skilled in the art according to the spirits and principle of the present invention, and such variants and modifications fall within the scope of the present invention.

For the implementation of the present invention containing the above embodiments, following supplements are further disclosed.

Supplement 1. A nonlinear term selection apparatus, comprising:

a linear coefficient calculator, configured to measure linear properties of a nonlinear system by using measurement data, so as to obtain a plurality of linear coefficients; and a nonlinear term selector, configured to select nonlinear model expanded terms of the nonlinear system by using the plurality of linear coefficients, so as to obtain nonlinear terms of the nonlinear system.

Supplement 2. The apparatus according to supplement 1, wherein the nonlinear term selector comprises:

a normalizer, configured to normalize the plurality of linear coefficients and form absolute values;

a comparator, configured to compare the coefficients outputted by the normalizer with a predefined threshold value; and a term acquirer, configured to acquire nonlinear terms of the nonlinear system based on the coefficients greater than or equal to the threshold value.

Supplement 3. The apparatus according to supplement 2, wherein the term acquirer is configured to:

take the coefficients greater than or equal to the threshold value as first-order term coefficients, and take the terms to which the first-order term coefficients correspond as first-order terms; and multiply the first-order term coefficients by N−1 order term coefficients in a pairwise manner, select the coefficients greater than or equal to the threshold value as N order term coefficients after combining products having identical terms, and take the terms to which the N order term coefficients correspond as N order terms; wherein N is a positive integer greater than 1.

Supplement 4. The apparatus according to supplement 2, wherein the term acquirer is configured to:

take the coefficients greater than or equal to the threshold value as first-order term coefficients, and take the terms to which the first-order term coefficients correspond as first-order terms; and multiply N coefficients selected from the first-order term coefficients and calculate all the combinations, select the coefficients greater than or equal to the threshold value as N order term coefficients after combining products having identical terms, and take the terms to which the N order term coefficients correspond as N order terms; wherein N is a positive integer greater than 1.

Supplement 5. A nonlinear term selection method, comprising:

measuring linear properties of a nonlinear system by using measurement data, so as to obtain a plurality of linear coefficients; and selecting nonlinear model expanded terms of the nonlinear system by using the plurality of linear coefficients, so as to obtain nonlinear terms of the nonlinear system.

Supplement 6. The method according to supplement 5, wherein the selecting nonlinear model expanded terms of the nonlinear system by using the plurality of linear coefficients comprises:

normalizing the plurality of linear coefficients and forming absolute values;

comparing the normalized coefficients with a predefined threshold value; and acquiring nonlinear terms of the nonlinear system based on the coefficients greater than or equal to the threshold value.

Supplement 7. The method according to supplement 6, wherein the acquiring nonlinear terms of the nonlinear system based on the coefficients greater than or equal to the threshold value comprises:

taking the coefficients greater than or equal to the threshold value as to first-order term coefficients, and taking the terms to which the first-order term coefficients correspond as first-order terms; and multiplying the first-order term coefficients by N−1 order term coefficients in a pairwise manner, selecting the coefficients greater than or equal to the threshold value as N order term coefficients after combining products having identical terms, and taking the terms to which the N order term coefficients correspond as N order terms; wherein N is a positive integer greater than 1.

Supplement 8. The method according to supplement 6, wherein the acquiring a nonlinear term of the nonlinear system based on the coefficients greater than or equal to the threshold value comprises:

taking the coefficients greater than or equal to the threshold value as first-order term coefficients, and taking the terms to which the first-order term coefficients correspond as first-order terms; and multiplying N coefficients selected from the first-order term coefficients and calculating all the combinations, selecting the coefficients greater than or equal to the threshold value as N order term coefficients after combining products having identical terms, and taking the terms to which the N order term coefficients correspond as N order terms; wherein N is a positive integer greater than 1.

Supplement 9. A nonlinear identification system, comprising:

a linear coefficient calculator, configured to measure linear properties of a nonlinear system by using measurement data, so as to obtain a plurality of linear coefficients;

a nonlinear term selector, configured to select nonlinear model expanded terms of the nonlinear system by using the plurality of linear coefficients, so as to obtain nonlinear terms of the nonlinear system;

a nonlinear coefficient calculator, configured to measure nonlinear properties of the nonlinear system by using measurement data, so as to obtain a plurality of nonlinear coefficients of the nonlinear system; and a nonlinear model builder, configured to obtain a nonlinear model of the nonlinear system according to the nonlinear terms and the nonlinear coefficients.

Supplement 10. The identification system according to supplement 9, wherein the nonlinear term selector comprises:

a normalizer, configured to normalize the plurality of linear coefficients and form absolute values;

a comparator, configured to compare the coefficients outputted by the normalizer with a predefined threshold value; and a term acquirer, configured to acquire nonlinear terms of the nonlinear system based on the coefficients greater than or equal to the threshold value.

Supplement 11. The identification system according to supplement 10, wherein the term acquirer is configured to take the coefficients greater than or equal to the threshold value as first-order term coefficients, and take the terms to which the first-order term coefficients correspond as first-order terms; and multiply the first-order term coefficients by N−1 order term coefficients in a pairwise manner, select the coefficients greater than or equal to the threshold value as N order term coefficients after combining products having identical terms, and take the terms to which the N order term coefficients correspond as N order terms; wherein N is a positive integer greater than 1.

Supplement 12. The identification system according to supplement 10, wherein the term acquirer is configured to take the coefficients greater than or equal to the threshold value as first-order term coefficients, and take the terms to which the first-order term coefficients correspond as first-order terms; and multiply N coefficients selected from the first-order term coefficients and calculate all the combinations, select the coefficients greater than or equal to the threshold value as N order term coefficients after combining products having identical terms, and take the terms to which the N order term coefficients correspond as N order terms; wherein N is a positive integer greater than 1.

Supplement 13. A nonlinear compensation system, comprising:

a linear coefficient calculator, configured to measure linear properties of an inverse system of a nonlinear system by using measurement data, so as to obtain a plurality of linear coefficients;

a nonlinear term selector, configured to select nonlinear model expanded terms of the inverse system by using the plurality of linear coefficients, so as to obtain nonlinear terms of the inverse system;

a nonlinear coefficient calculator, configured to measure nonlinear properties of the inverse system by using measurement data, so as to obtain a plurality of nonlinear coefficients of the inverse system; and a nonlinear model compensator, configured to obtain a compensation model of the nonlinear system according to the nonlinear terms and the nonlinear coefficients of the inverse system.

Supplement 14. The compensation system according to supplement 13, wherein the nonlinear term selector comprises:

a normalizer, configured to normalize the plurality of linear coefficients and form absolute values;

a comparator, configured to compare the coefficients outputted by the normalizer with a predefined threshold value; and a term acquirer, configured to acquire nonlinear terms of the nonlinear system based on the coefficients greater than or equal to the threshold value.

Supplement 15. The compensation system according to supplement 14, wherein the term acquirer is configured to take the coefficients greater than or equal to the threshold value as first-order term coefficients, and take the terms to which the first-order term coefficients correspond as first-order terms; and multiply the first-order term coefficients by N−1 order term coefficients in a pairwise manner, select the coefficients greater than or equal to the threshold value as N order term coefficients after combining products having identical terms, and take the terms to which the N order term coefficients correspond as N order terms; wherein N is a positive integer greater than 1.

Supplement 16. The compensation system according to supplement 14, wherein the term acquirer is configured to take the coefficients greater than or equal to the threshold value as first-order term coefficients, and take the terms to which the first-order term coefficients correspond as first-order terms; and multiply N coefficients selected from the first-order term coefficients and calculate all the combinations, select the coefficients greater than or equal to the threshold value as N order term coefficients after combining products having identical terms, and take the terms to which the N order term coefficients correspond as N order terms; wherein N is a positive integer greater than 1.

Supplement 17. A transmitter, comprising the compensation system as described in any one of supplements 13-16.

Supplement 18. A receiver, comprising the compensation system as described in any one of supplements 13-16.

Supplement 19. A communication system, comprising the transmitter as described in supplement 17 or the receiver as described in supplement 18.

The invention claimed is:

1. A nonlinear term selection apparatus of a communication system, the apparatus comprising:
one of a receiver and a transmitter of the communication system, the one of the receiver and transmitter comprising:
a linear coefficient calculator, configured to measure linear properties of a nonlinear system by using measurement data, so as to obtain a plurality of linear coefficients; and a nonlinear term selector, configured to select nonlinear model expanded terms of the nonlinear system by using the plurality of linear coefficients, discarding the terms of relatively less contribution in the nonlinear model expanded terms while keeping the terms of relatively more contribution therein, so as to obtain nonlinear terms of the nonlinear system,
wherein the nonlinear term selector comprises:
a normalizer, configured to normalize the plurality of linear coefficients and form absolute values;
a comparator, configured to compare the coefficients outputted by the normalize with a predefined threshold value; and
a term acquirer, configured to acquire nonlinear terms of the nonlinear system based on the coefficients greater than or equal to the threshold value.

2. The apparatus according to claim 1, wherein the term acquirer is configured to:
take the coefficients greater than or equal to the threshold value as first-order term coefficients, and take the terms to which the first-order term coefficients correspond as first-order terms; and
multiply the first-order term coefficients by N−1 order term coefficients in a pairwise manner, select the coefficients greater than or equal to the threshold value as N order term coefficients after combining products having identical terms, and take the terms to which the N order term coefficients correspond as N order terms; wherein N is a positive integer greater than 1.

3. The apparatus according to claim 1, wherein the term acquirer is configured to:
take the coefficients greater than or equal to the threshold value as first-order term coefficients, and take the terms to which the first-order term coefficients correspond as first-order terms; and
multiply N coefficients selected from the first-order term coefficients and calculate all the combinations, select the coefficients greater than or equal to the threshold value as N order term coefficients after combining products having identical terms, and take the terms to which the N order term coefficients correspond as N order terms; wherein N is a positive integer greater than 1.

4. A nonlinear term selection method of a communication system, the apparatus comprising:
one of a receiver and a transmitter of the communication system method, the method of the one of the receiver and the transmitter comprising:
measuring linear properties of a nonlinear system by using measurement data, so as to obtain a plurality of linear coefficients; and
selecting nonlinear model expanded terms of the nonlinear system by using the plurality of linear coefficients, discarding the terms of relatively less contribution in the nonlinear model expanded terms while keeping the terms of relatively more contribution therein, so as to obtain nonlinear terms of the nonlinear system,
wherein the selecting nonlinear model expanded terms of the nonlinear system by using the plurality of linear coefficients comprises:
normalizing the plurality of linear coefficients and forming absolute values;
comparing the normalized coefficients with a predefined threshold value; and acquiring nonlinear terms of the nonlinear system based on the coefficient greater than or equal to the threshold value.

5. The method according to claim 4, wherein the acquiring nonlinear
terms of the nonlinear system based on the coefficients greater than or equal to the threshold value comprises:
taking the coefficients greater than or equal to the threshold value as first-order term coefficients, and taking the terms to which the first-order term coefficients correspond as first-order terms; and
multiplying the first-order term coefficients by N−1 order term coefficients in a pairwise manner, selecting the coefficients greater than or equal to the threshold value as N order term coefficients after combining products having identical terms, and taking the terms to which the N order term coefficients correspond as N order terms; wherein N is a positive integer greater than 1.

6. The method according to claim 4, wherein the acquiring a nonlinear term of the nonlinear system based on the coefficients greater than or equal to the threshold value comprises:
taking the coefficients greater than or equal to the threshold value as first-order term coefficients, and taking the terms to which the first-order term coefficients correspond as first-order terms; and
multiplying N coefficients selected from the first-order term coefficients and calculating all the combinations, selecting the coefficients greater than or equal to the threshold value as N order term coefficients after combining products having identical terms, and taking the terms to which the N order term coefficients correspond as N order terms; wherein N is a positive integer greater than 1.

7. A nonlinear identification system of a communication system, the apparatus comprising,
one of a receiver and a transmitter of communication system, the one of the receiver and transmitter comprising:
a linear coefficient calculator, configured to measure linear properties of a nonlinear system by using measurement data, so as to obtain a plurality of linear coefficients;
a nonlinear term selector, configured to select nonlinear model expanded terms of the nonlinear system by using the plurality of linear coefficients, discarding the terms of relatively less contribution in the nonlinear model expanded terms while keeping the terms of relatively more contribution therein, so as to obtain nonlinear terms of the nonlinear system;
a nonlinear coefficient calculator, configured to measure nonlinear properties of the nonlinear system by using measurement data, so as to obtain a plurality of nonlinear coefficients; and
a nonlinear model builder, configured to obtain a nonlinear model of the nonlinear system according to the nonlinear terms and the nonlinear coefficients,
wherein the nonlinear term selector comprises:
a normalizer, configured to normalize the plurality of linear coefficients and form absolute values;
a comparator, configured to compare the coefficients outputted by the normalize with a predefined threshold value; and
a term acquirer, configured to acquire nonlinear terms of the nonlinear system based on the coefficients greater than or equal to the threshold value.

8. A nonlinear compensation system of a communication system, the apparatus comprising:
one of a receiver and a transmitter of communication system, the One of the receiver and transmitter comprising:
a linear coefficient calculator, configured to measure linear properties of an inverse system of a nonlinear system by using measurement data, so as to obtain a plurality of linear coefficients;
a nonlinear term selector, configured to select nonlinear model expanded terms of the inverse system by using the plurality of linear coefficients, discarding the terms of relatively less contribution in the nonlinear model expanded terms while keeping the terms of relatively more contribution therein, so as to obtain nonlinear terms of the inverse system;
a nonlinear coefficient calculator, configured to measure nonlinear properties of the inverse system by using measurement data, so as to obtain a plurality of nonlinear coefficients; and
a nonlinear model compensator, configured to obtain a compensation model of the nonlinear system according to the nonlinear terms and the nonlinear coefficients of the inverse system,
wherein the nonlinear term selector comprises:
a normalizer, configured to normalize the plurality of linear coefficients and form absolute values;
a comparator, configured to compare the coefficients outputted by the normalize with a predefined threshold value; and
a term acquirer, configured to acquire nonlinear terms of the nonlinear system based on the coefficients greater than or equal to the threshold value.

* * * * *